United States Patent
Sagawa et al.

(10) Patent No.: US 10,538,429 B2
(45) Date of Patent: Jan. 21, 2020

(54) MEMS MANUFACTURING SYSTEM AND MEMS MANUFACTURING METHOD

(71) Applicant: Hitachi, Ltd., Chiyoda-ku, Tokyo (JP)

(72) Inventors: Misuzu Sagawa, Tokyo (JP); Atsushi Isobe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/030,256

(22) Filed: Jul. 9, 2018

(65) Prior Publication Data

US 2019/0084830 A1 Mar. 21, 2019

(30) Foreign Application Priority Data

Sep. 15, 2017 (JP) ................................ 2017-177638

(51) Int. Cl.
*B81C 99/00* (2010.01)

(52) U.S. Cl.
CPC ........ *B81C 99/006* (2013.01); *B81C 99/0025* (2013.01); *B81C 99/0065* (2013.01)

(58) Field of Classification Search
CPC ............................ B81C 99/006; B81C 99/002
See application file for complete search history.

(56) References Cited

U.S. PATENT DOCUMENTS 7,267,731 B2 9/2007 Iwasaki
2011/0250706 A1* 10/2011 Huff ..................... B81C 99/006
438/5

FOREIGN PATENT DOCUMENTS

JP 7-302826 A 11/1995
JP 2004-209626 A 7/2004

* cited by examiner

*Primary Examiner* — Stacy Whitmore
(74) *Attorney, Agent, or Firm* — Crowell & Moring LLP (57) ABSTRACT

In a calculator in a MEMS manufacturing system, a stage control unit inclines a stage based on a stage angle 1 setting a stage inclination angle and a stage angle 2 of the inclination angle different from the stage angle 1. A stage-angle calculation unit calculates the stage inclination angles from first and second images acquired by a SEM apparatus when the stage control unit sets the stage at the stage angles 1 and 2. A 3D-data creation unit creates three-dimensional device data from a third image that is a device image acquired when the stage is set at the stage angle 1 and a fourth image that is a device image acquired when the stage is set at the stage angle 2. When the three-dimensional device data is created, a correction value calculated from the stage angles 1 and 2 and the first and second images is used.

15 Claims, 8 Drawing Sheets

MEMS MANUFACTURING SYSTEM AND MEMS MANUFACTURING METHOD

CROSS-REFERENCE TO RELATED APPLICATION

The present application claims priority from Japanese Patent Application No. 2017-177638 filed on Sep. 15, 2017, the content of which is hereby incorporated by reference into this application.

TECHNICAL FIELD OF THE INVENTION

The present invention relates to a MEMS manufacturing system and a MEMS manufacturing method. Particularly, the present invention relates to a technique that is effective to three-dimensionally acquire a device structure formed on a MEMS (Micro Electro Mechanical Systems).

BACKGROUND OF THE INVENTION

In recent years, MEMS devices are used in various fields such as a printer head and a mirror device of a projector. In the development of the MEMS devices, for example, creation of a trial device by using a semiconductor manufacturing technique has been widely popularized.

For the MEMS device, it is important to provide a desirable device property that is finally completed. This device property depends on the fabricated device structure.

As a technique for accurately forming the device structure of this type, a technique is known (see, for example, Japanese Patent Application Laid-Open Publication No. 2004-209626 (Patent Document 1)), the technique, for example, acquiring a plurality of images of the trial device while changing an angle of the image, measuring a three-dimensional shape of the trial device, and changing process data of the device based on difference data obtained by comparing the three-dimensional shape and CAD data of design in a dimension.

As another technique for forming the device structure, a technique is known (see, for example, Japanese Patent Application Laid-Open Publication No. H07-302826 (Patent Document 2)), the technique measuring a device gate length that is two-dimensional information, calculating a property from a result of the measurement, and feeding back a result of the calculation to a next step.

SUMMARY OF THE INVENTION

However, in the technique for creating the trail device utilizing the above-described semiconductor manufacturing techniques, it takes long time such as one year or longer for the development and trial in many cases, and therefore, the techniques have problems that is incapable of releasing a product in a short period of time and that causes a lot of development cost.

Particularly, it is finally recognized whether or not the fabricated device has a desirable property after the completion of the device fabrication process to complete the device and the measurement of the property of the device. Such feedback delay of the trial device is one of reasons for a long-term trial period.

And, when the plurality of images are acquired in the above-described technique of the Patent Document 1, inclination of the stage is proposed for changing the angle. However, an angle made by an image-captured target and an image-capturing unit possibly cannot be a setting angle. As a result, there is a risk of causing errors in the measured three-dimensional shape so that a high-accurate device structure cannot be formed.

In the technique of the Patent Document 2, when edges do not clearly appear as seen in a process such as FIB (Focused ion Beam), errors are possibly caused because the three-dimensional stereoscopic device structure is represented by a gate length at one part.

In order to accurately estimate the device property in the middle of the manufacturing process for shortening the trial period, it is required to accurately three-dimensionally acquire the fabricated device structure that is a model structure for estimating the device property.

An object of the present invention is to provide a technique capable of accurately estimating a device property in middle of a manufacturing process by accurately acquiring a three-dimensional stereoscopic shape of a device formed on a MEMS.

The above and other object and novel characteristics of the present invention will be apparent from the description of the present specification and the accompanying drawings.

The summary of the typical aspects of the inventions disclosed in the present application will be briefly described as follows.

That is, a typical MEMS manufacturing system has an image acquirement unit and a manufacturing process unit. The image acquirement unit acquires image information of the MEMS. The manufacturing process unit creates a three-dimensional image of the device formed on the MEMS from the image information acquired by the image acquirement unit, analyzes the created three-dimensional image to estimate a device property, and corrects a manufacturing recipe of the MEMS.

The image acquirement unit has a stage on which the MEMS is placed. The manufacturing process unit has a stage control unit, a stage-angle calculation unit, and a 3D-data creation unit. The stage control unit inclines the stage based on a first stage inclination angle that sets an inclination angle of the stage on which the MEMS is placed and a second stage inclination angle that is a different inclination angle from the first stage inclination angle.

The stage-angle calculation unit calculates each stage inclination angle from a first image that is an image for calculating the stage inclination angle acquired by the image acquirement unit when the stage control unit sets the stage at the first stage inclination angle and a second image that is an image for calculating the stage inclination angle acquired by the image acquirement unit when the stage control unit sets the stage at the second stage inclination angle.

The 3D-data creation unit creates three-dimensional device data from a third image that is a device image acquired when the image acquirement unit sets the stage at the first stage inclination angle and a fourth image that is a device image acquired when the image acquirement unit sets the stage at the second stage inclination angle.

This 3D-data creation unit uses a correction value calculated from the first stage inclination angle set by the stage control unit and the second stage inclination angle set by the stage control unit when the three-dimensional device data is created and from the acquired first and second images.

Particularly, the 3D-data creation unit calculates each of a difference between the first stage inclination angle set by the stage control unit and the stage inclination angle calculated from the first image by the stage-angle calculation unit and a difference between the second stage inclination angle set by the stage control unit and the stage inclination angle calculated from the second image by the stage-angle calculation unit, and uses each of the calculated inclination angle differences as the correction value.

The effects obtained by the typical aspects of the present invention disclosed in the present application will be briefly described as follows.

(1) A three-dimensional device image having a small shape error and high accuracy can be acquired.

(2) A development period of a MEMS can be shortened.

DESCRIPTIONS OF THE PREFERRED EMBODIMENTS

The same components are denoted by the same reference symbols in principle throughout all the drawings for describing the embodiments, and the repetitive description thereof will be omitted.

First Embodiment

<Structure Example of MEMS Manufacturing System>
An embodiment will be described in detail below.

Figure 1:
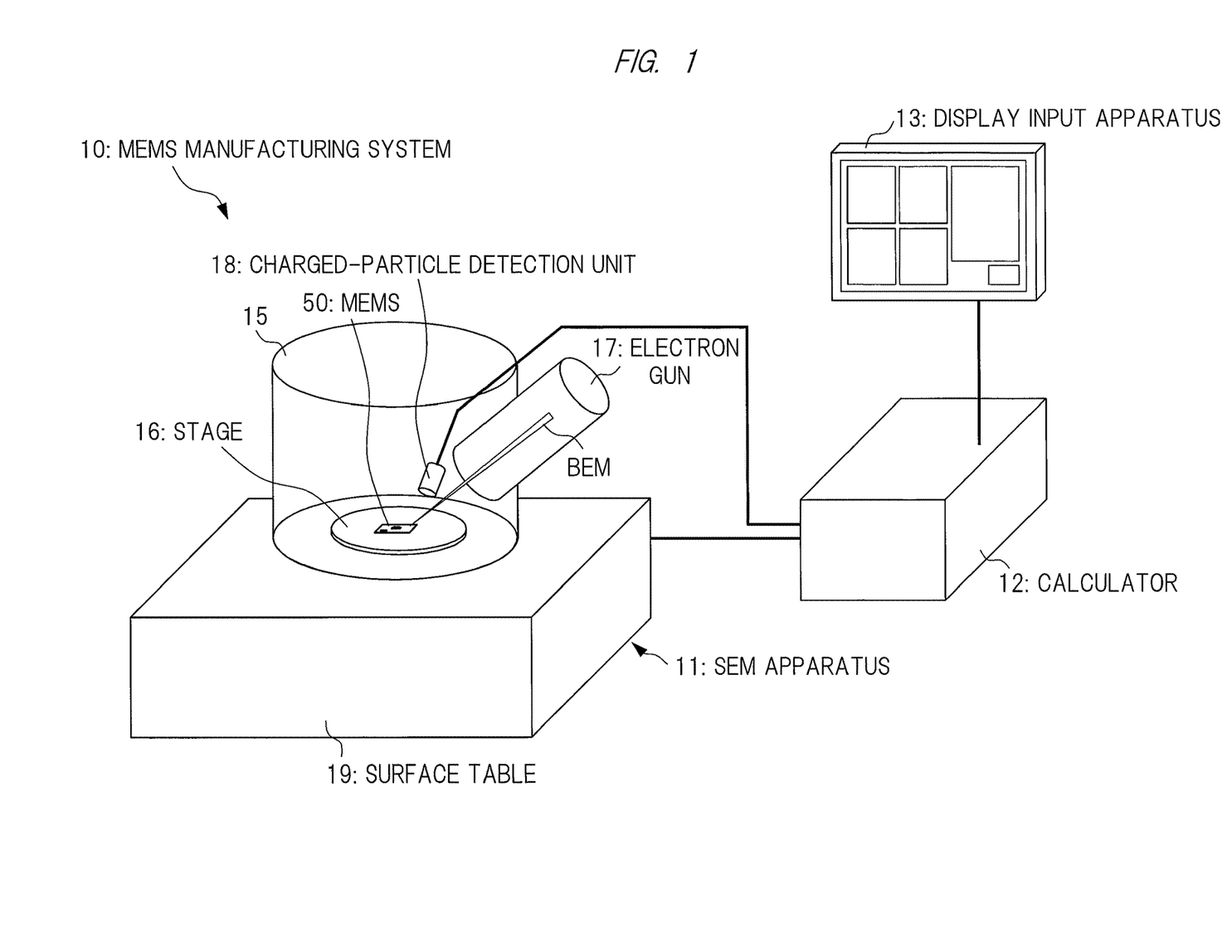
FIG. 1 is an explanatory diagram showing one example of a structure in a MEMS manufacturing system according to a first embodiment.

FIG. 1 is an explanatory diagram showing one example of a structure in a MEMS manufacturing system according to a first embodiment.

A MEMS manufacturing system 10 has a SEM apparatus 11, a calculator 12, and a display input apparatus 13. The SEM apparatus 11 that is an image acquirement unit is configured of a Scanning Electron Microscope (SEM), and acquires image information of an observation region of a MEMS 50 that is a sample.

The SEM apparatus 11 is provided with a vacuum chamber 15 that shields the MEMS 50 that is the sample from ambient air. Inside this vacuum chamber 15, a stage 16 on which the MEMS 50 is placed and which moves the MEMS 50 is provided.

The MEMS 50 is a device having a structure including, for example, a sensor, an actuator, an electronic circuit and others, that are mechanical element components, on a semiconductor silicon substrate, a glass substrate, an organic material or others.

In an upper part in the vacuum chamber 15, each of an electron gun 17 and a charged-particle detection unit 18 is provided. The electron gun 17 emits electron beam BEM. A position of the irradiation with the electron beam BEM emitted from this electron gun 17 is controlled by a scan coil not shown in the drawing.

An electronic optical system not shown is housed below the electron gun 17 inside the vacuum chamber 15. The charged-particle detection unit 18 detects charged particles emitted from the MEMS 50 by the irradiation with the electron beam BEM generated by the electron gun 17. The vacuum chamber 15 is placed on, for example, a surface table 19.

The calculator 12 that is a manufacturing process unit is configured of, for example, a personal computer, a workstation, or others. This calculator 12 controls movement of the SEM apparatus 11 such as movement of the stage 16, captures the charged particles acquired by the SEM apparatus 11, and performs the scan using the electron beam BEM, in other words, creates a SEM image of the MEMS 50 in an irradiated region.

The calculator 12 creates three-dimensional data, that is, a three-dimensional image based on image analysis, performs CAD modelling conversion of point group data, and performs processes such as a process of comparing a result of property calculation based on the CAD model with a manufacturing property based on design data and a process of feedback to a next step.

The display input apparatus 13 is an interface which is connected to the calculator 12, which displays an image created by the calculator 12 such as a SEM image and an image analysis result, and which inputs/outputs various pieces of information such as an image condition, an analysis condition, and a calculation condition.

Figure 2:
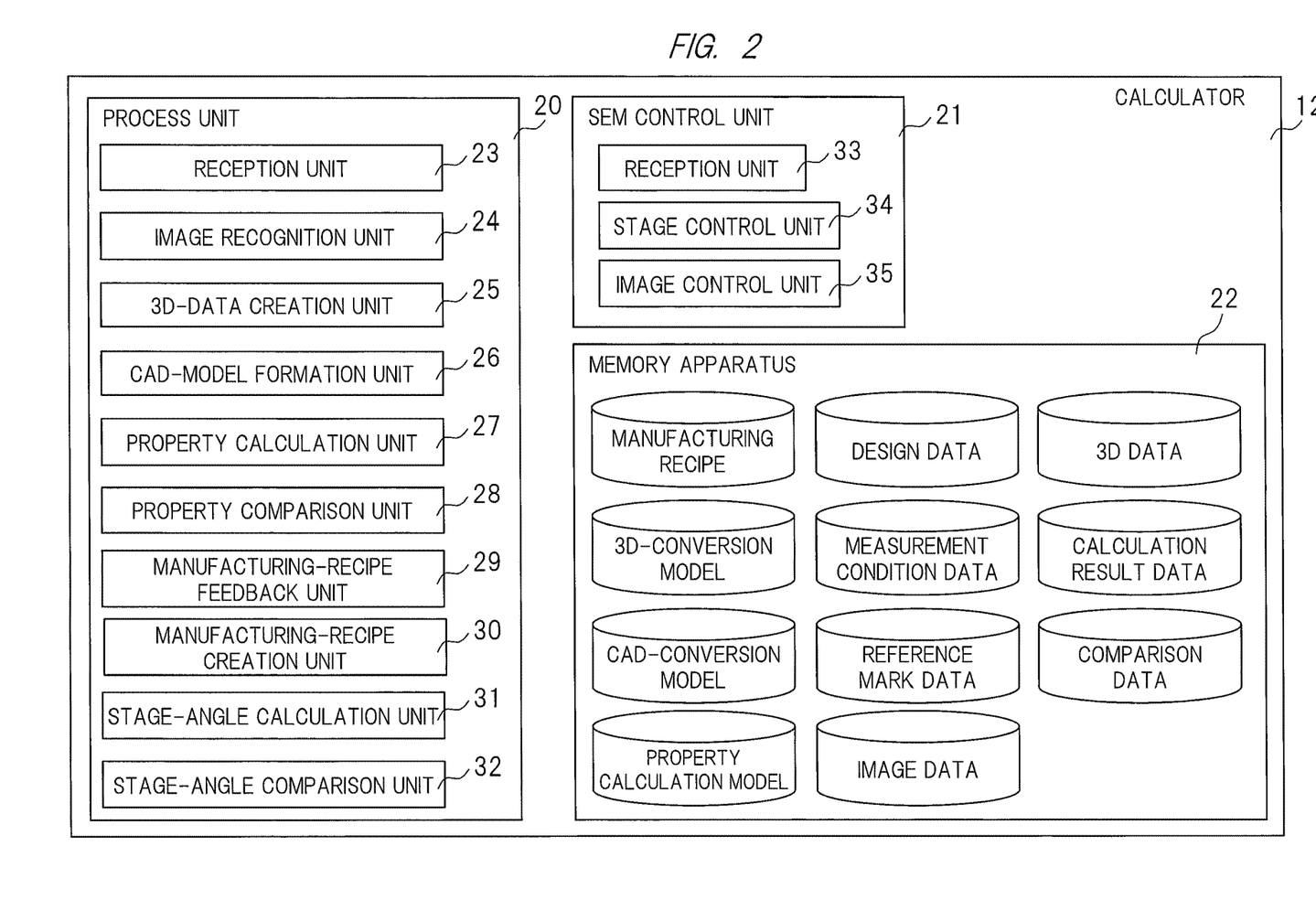
FIG. 2 is an explanatory diagram showing one example of a structure in a calculator included in the MEMS manufacturing system of FIG. 1.

<Structure Example of Calculator>
FIG. 2 is an explanatory diagram showing one example of a structure in the calculator 12 included in the MEMS manufacturing system 10 of FIG. 1.

As shown in FIG. 2, the calculator 12 has a process unit 20, a SEM control unit 21, and a memory apparatus 22. The process unit 20 measures and analyzes a surface shape of the MEMS 50, and feeds back a result of the analysis to a next step.

Specifically, the surface shape of the MEMS 50 is three-dimensionally measured and acquired, and the acquired three-dimensional data is analyzed. And, a property of the MEMS 50 is estimated based on the result of the analysis, the estimated property is compared with a manufacturing property based on the design data, and a result of the comparison is fed back to a next manufacturing step.

The process unit 20 has a reception unit 23, an image recognition unit 24, a 3D (three-dimensional)-data creation unit 25, a CAD-model formation unit 26, a property calculation unit 27, a property comparison unit 28, a manufacturing-recipe feedback unit 29, a manufacturing-recipe creation unit 30, a stage-angle calculation unit 31, and a stage-angle comparison unit 32.

The reception unit 23 receives the design data of the MEMS 50 that is input from the display input apparatus 13 of FIG. 1. The image recognition unit 24 recognizes the image acquired by the SEM apparatus 11. The 3D-data creation unit 25 creates the three-dimensional data, that is, the three-dimensional image of the MEMS 50.

The CAD-model formation unit 26 creates a CAD model from the three-dimensional data of the MEMS 50 created by the 3D-data creation unit 25. The property calculation unit 27 calculates a property of the MEMS 50 from the CAD model created by the CAD-model formation unit 26. Also, the property calculation unit 27 calculates a property in the CAD model based on the design data.

The property comparison unit 28 compares the property calculated by the property calculation unit 27, and outputs a result of the comparison. To a manufacturing recipe, the manufacturing-recipe feedback unit that is a manufacturing-recipe correction unit feeds back a result of the comparison output from the property calculation unit 27.

The manufacturing-recipe creation unit 30 creates the manufacturing recipe of the MEMS 50 based on the design data received by the reception unit 23. The stage-angle calculation unit 31 calculates a stage angle that is an angle of the stage 16 of FIG. 1 from reference mark data, measurement condition data, and others.

The stage-angle comparison unit 32 compares the stage angle calculated by the stage-angle calculation unit 31 with a previously setting value, and determines whether a result of the comparison is within a range of the setting value or not. The SEM control unit 21 controls movement of the SEM apparatus 11. This SEM control unit 21 has a reception unit 33, a stage control unit 34, and an image control unit 35. A positional alignment process unit is configured of the image recognition unit 24 and the stage control unit 34.

The reception unit 33 receives the measurement condition data input from the display input apparatus 13. The stage control unit 34 controls the movement of the stage 16 based on the measurement condition data. The image control unit 35 reads an image from the SEM apparatus 11 based on the measurement condition data, and stores the image and a condition in the image acquirement as the image data into the memory apparatus 22.

The memory apparatus 22 that is a storage unit is a memory that stores various pieces of data, and is configured of, for example, a nonvolatile memory represented by a hard disk drive, a flash memory or others. The memory apparatus 22 mainly stores the manufacturing recipe, the 3D-conversion model, the CAD-conversion model, the property calculation model, the design data, the measurement condition data, the reference mark data, the image data, the 3D data, the calculation result data, the comparison data, and others.

The manufacturing recipe is data created by the manufacturing-recipe creation unit 30, the data showing process conditions for a manufacturing apparatus that manufactures the MEMS 50 when a device to be formed, that is, the MEMS 50 is formed. For example, the conditions are etching conditions or others in a case of a manufacturing apparatus for an etching process, or are so-called film deposition conditions or others in a case of a manufacturing apparatus for a film-forming process.

The etching conditions are conditions such as coordinates of an etching position, an application voltage in the etching, and etching time. The film deposition conditions are conditions such as a type of film formation, a type of gas, coordinates of a film-formation position, and an application voltage and film-formation time in the film formation.

The 3D-conversion model is a calculation model that calculates the three-dimensional data from the image data. The CAD-conversion model is an element model having a format suitable for the calculation of the property by the property calculation unit 27. The property calculation model is a model used for calculating a property of an element formed on a substrate of the MEMS 50.

The design data is data related to the design of the MEMS 50 for creating dimensional data. The measurement condition data is data used for calculating the three-dimensional data created by the 3D-data creation unit 25.

This measurement condition data is data formed of, for example, a stage angle of the stage 16 at the time of the image acquirement, a position of a measurement portion indicated by coordinates or others, a magnification of the image at the time of image capturing, a position of the positional alignment, a reference mark to be measured, and others.

The reference mark data is data formed of a shape of the reference mark formed on the substrate, positional coordinates, a dimension and others. The reference mark is a reference point, and is used when the inclination angle of the stage 16 described later is calculated. The image data is data formed of an image captured by the SEM apparatus 11, that is, a SEM image, and formed of an image-capturing condition at the time of the acquirement of the captured image, the data being stored into the memory apparatus 22 by the above-described image control unit 35.

The 3D data is three-dimensional data of the device formed on the MEMS 50, the data being calculated from the image data by the 3D-data creation unit 25. The calculation result data is data of a calculation result of the property of the device formed on the MEMS 50, the data being calculated by the property calculation unit 27. The comparison data is data of a comparison result between the device property of the MEMS 50 calculated by the property calculation unit 27 and the device property in the CAD model based on the design data.

<Process Example of MEMS System>

Subsequently, one example of a manufacturing process of the MEMS 50 performed by the MEMS manufacturing system 10 will be described.

Figure 3:
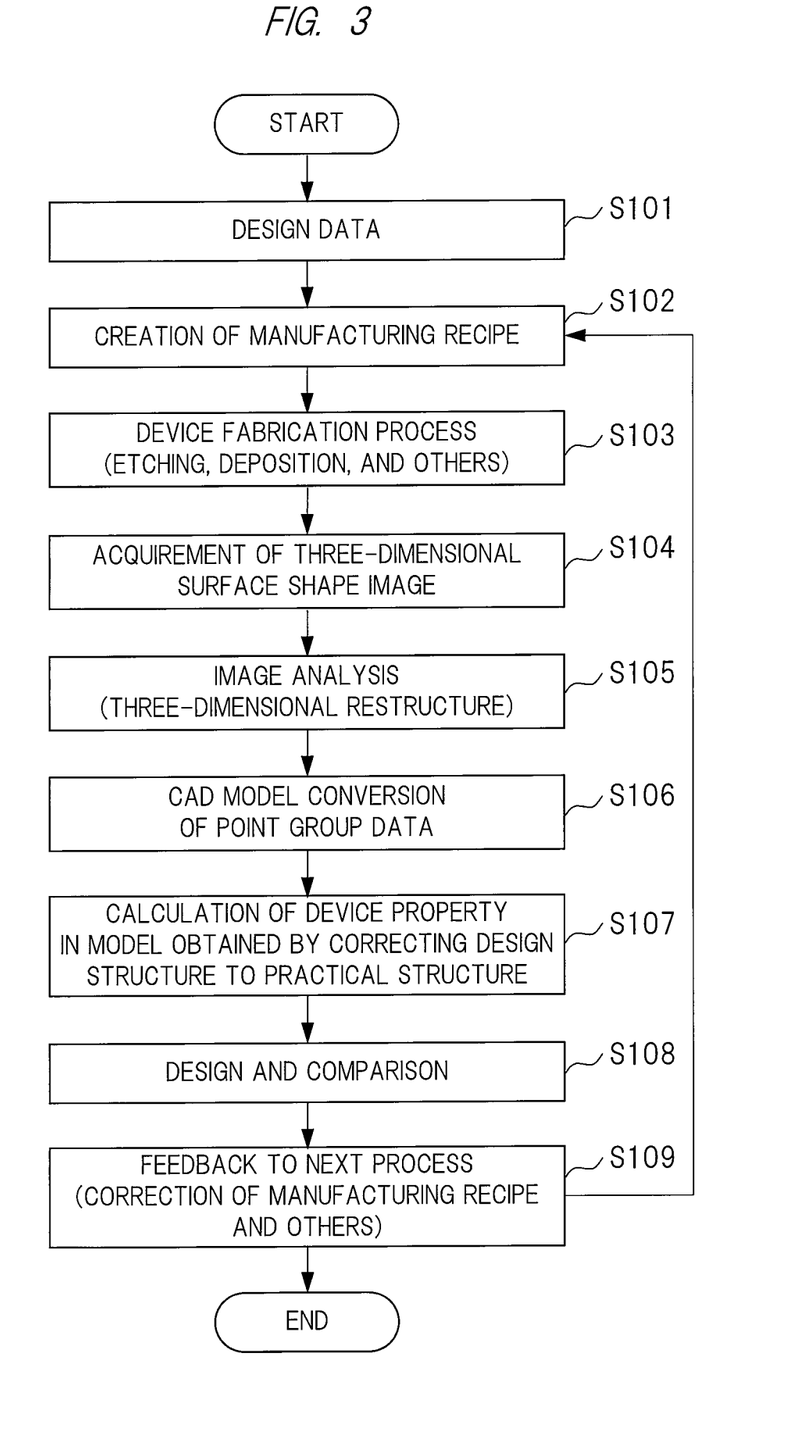
FIG. 3 is a flowchart showing one example of an entire process in MEMS manufacturing performed by the MEMS manufacturing system of FIG. 1.

FIG. 3 is a flowchart showing one example of an entire process in MEMS manufacturing performed by the MEMS manufacturing system of FIG. 1. The process of FIG. 3 is repeated for, for example, every layer manufacturing of the MEMS 50.

First, the design data is input from the display input apparatus 13 (Step S101). The input design data is received by the reception unit 23, and then, is stored in the memory apparatus 22. The manufacturing-recipe creation unit 30 creates the manufacturing recipe of the MEMS 50 based on the input design data (S102), and stores the created manufacturing recipe into the memory apparatus 22.

Then, the process proceeds to a device fabrication step (step S103). This device fabrication step is a step of manufacturing the MEMS 50 based on the manufacturing recipe stored in the memory apparatus 22.

At the device fabrication step, the MEMS 50 is fabricated by, for example, performing the etching process, the film formation process, and others to a semiconductor substrate as described above for every layer by using a semiconductor manufacturing apparatus and others using a semiconductor manufacturing technique.

Subsequently, the image data of the three-dimensional surfaces shape of the device formed on the MEMS 50 at the process of the step S103 is acquired (step S104). Note that a process of this step S104 will be described in detail in FIG. 4 later.

Image analysis of the acquired image data is performed (step S105), and the three-dimensional image is created based on a result of the analysis. At a process of this step S105, the 3D-data creation unit 25 reads the SEM image from the image data acquired at the step S104, and reads the stage angle and the magnification at the time of measurement, creates the CAD model based on the 3D data stored in the memory apparatus 22, and stores the created CAD model into the memory apparatus 22.

Subsequently, the CAD-model formation unit 26 converts the point group data into CAD-conversion model data (step S106). At a process of this step S106, the CAD-model formation unit 26 reads the 3D data stored in the memory apparatus 22 created at the process of the step S105, inputs the 3D data into the CAD model to create the CAD model based on the 3D data, and stores the CAD model into the memory apparatus 22.

The property calculation unit 27 reads the CAD model based on the 3D data created at the process of the step S106, and calculates the property of the device having the practical structure based on the property calculation model read from the memory apparatus 22 (step S107), and then, stores a result of the calculation into the memory apparatus 22. And, the property calculation unit 27 similarly calculates the property of the device having the practical structure for the CAD model based on the design data, and stores a result of the calculation into the memory apparatus 22.

Subsequently, the property comparison unit 28 compares the device property based on the 3D data calculated at the process of the step S107 with the device property based on the design data stored in the memory apparatus 22 (step S108).

The manufacturing-recipe feedback unit 29 corrects a manufacturing step for a next layer to be a next step based on a result of the comparison in the property comparison unit 28, and corrects the manufacturing recipe stored in the memory apparatus 22 based on a result of the correction (step S109).

In the above-described manner, the entire manufacturing process in the MEMS manufacturing ends.

<Creation Example of Three-Dimensional Image>

Subsequently, the process of the step S104 of FIG. 3 will described.

Figure 4:
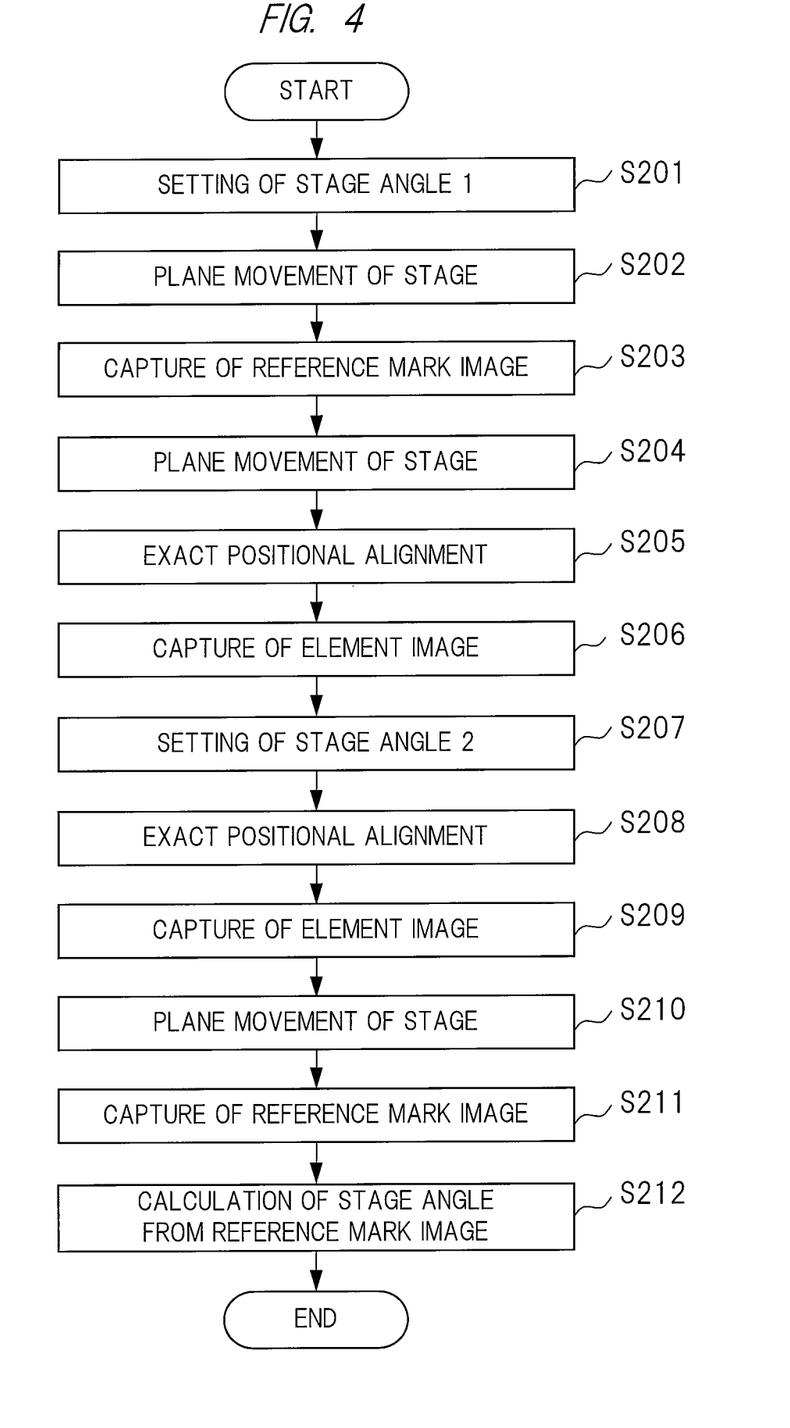
FIG. 4 is a detailed flowchart at a process of a step S104 of FIG. 3.

FIG. 4 is a detailed flowchart at the process of the step S104 of FIG. 3.

First, after the device of the MEMS 50 is formed at the process of the step S103 of FIG. 3, a stage control unit 34 of the SEM control unit 21 reads a stage angle 1 from the measurement condition data input from the display input apparatus 13, and performs control so that the stage 16 is set at an inclination angle of the read stage angle 1 (step S201). The stage angle 1 is a first stage inclination angle.

The stage control unit 34 similarly reads the reference mark data to be a reference from the memory apparatus 22, and performs control based on the read reference mark data so that the stage 16 moves in plane to a position at which an image of the reference mark is intended to be captured (step S202).

Once the stage 16 moves in plane at the process of the step S202, the image control unit 35 captures and acquires the image of the reference mark formed on the MEMS 50 by using the SEM apparatus 11 (step S203). This image becomes a first image.

The image control unit 35 stores the acquired image into the memory apparatus 22. The image-capturing magnification, the image-capturing position and others are set based on the measurement condition data to capture the image of the reference mark.

Subsequently, the stage control unit 34 controls the plane movement of the stage 16 so that the image of the device that is an image-capturing target to be evaluated is intended to be captured (step S204). At a process of this step S204, the stage control unit 34 acquires the position of the device whose image is captured, from the measurement condition data, and moves the stage 16.

Once the plane movement of the stage 16 ends, the stage control unit 34, the image control unit 35, and the image recognition unit 24 execute an exact positional alignment process (step S205). At a process of this step S205, the image recognition unit 24 acquires an exact position of the device from the measurement condition data, and the image control unit 35 acquires and sets the image-capturing magnification from the measurement condition data. Then, the image of the device whose position is to be aligned is recognized by the image recognition unit 24 so as to perform the exact positional alignment.

Once the exact positional alignment ends, the image control unit 35 allows the SEM apparatus 11 to capture and acquire the image of the device based on the measurement condition data (step S206), and stores the acquired image into the memory apparatus 22. This image becomes a third image.

Subsequently, the stage control unit 34 acquires a stage angle 2 from the measurement condition data, and sets the stage 16 at the acquired stage angle 2 (step S207). Here, the stage angle 2 is an inclination angle that is different from the stage angle 1 set at the process of the step S201. The stage angle 2 is a second stage inclination angle.

Once the stage 16 is set at the stage angle 2, the stage control unit 34 acquires the image of the device again, and executes the exact positional alignment process (step S208).

Once the exact positional alignment process ends, the image of the device is captured and acquired by the SEM apparatus 11 (step S209) as similar to the process of the step S206, and the acquired image is stored in the memory apparatus 22. This image becomes a fourth image.

Subsequently, the stage control unit 34 reads the reference mark data from the memory apparatus 22, and controls the stage 16 based on the read reference mark data so as to move in plane to a position at which the image of the reference mark is intended to be captured (step S210).

Once the stage 16 moves in plane at the process of the step S210, the image control unit 35 allows the SEM apparatus 11 to capture and acquire the image of the reference mark formed on the MEMS 50 again (step S211). This image becomes a second image.

The image control unit 35 stores the acquired image into the memory apparatus 22. The image-capturing magnification, the image-capturing position and others are set based on the measurement condition data to capture the image of the reference mark.

The stage-angle calculation unit 31 calculates the stage angle 1 and the stage angle 2 from the reference mark image acquired at the process of the step S203 and the process of the step S211, respectively (step S212), and stores the calculated stage angle 1 and stage angle 2 into the memory apparatus 22.

In the above-described manner, the process of the step S104 of FIG. 3 ends.

Then, the 3D-data creation unit 25 executes a three-dimensional restructure process of creating the three-dimensional image of the target device, that is a process of a step S105 of FIG. 3. In this three-dimensional restructure process, the inclination angles of the stage 16 are used as one of parameters for creating the three-dimensional image.

At this time, the inclination angles of the stage 16 can be accurately acquired by using absolute values of a difference between the stage angle 1 calculated at the process of the step S212 and the stage angle 1 set at the process of the step S201 and a difference between the stage angle 2 calculated at the process of the step S212 and the stage angle 2 set at the process of the step S207 as correction values of the inclination angles of the stage 16, respectively.

The three-dimensional image is created by using the accurate inclination angles of the stage 16 as described above, so that the accurate three-dimensional image can be acquired, the accurate three-dimensional image reducing the shape error due to errors in the inclination angles of the stage 16.

<Exact Positional Alignment Process>

Subsequently, the above-described exact positional alignment process will be described.

FIG. 5 is an explanatory diagram showing one example of the exact positional alignment process at a process of a step S205 and a process of a step S208 of FIG. 4.

Figure 5A:
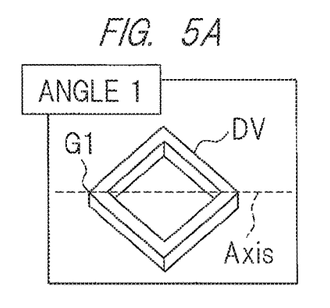
FIG. 5A is an explanatory diagram showing one example of an exact positional alignment process at a process of a step S205 and a process of a step S208 of FIG. 4.

First, at the step S205 of FIG. 4, as shown in FIG. 5A, the positional alignment is performed so that an origin "G1" of an image of a device DV acquired at the inclination angle at which the angle of the stage 16 is the stage angle 1 matches a virtual axis "Axis" in the image of the device DV.

Figure 5B:
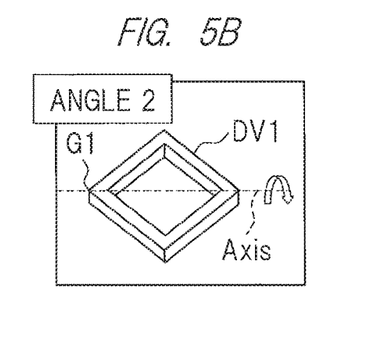
FIG. 5B is an explanatory diagram showing one example of an exact positional alignment process at a process of a step S205 and a process of a step S208 of FIG. 4.

And, at the step S208 of FIG. 4, as shown in FIG. 5B, the positional alignment is performed so that an origin "G1" of an image of the device DV1 acquired at the inclination angle at which the angle of the stage 16 is the stage angle 2 matches the virtual axis "Axis" of the device DV1.

The origin G1 is provided on the virtual axis Axis. In an example of FIGS. 5A to 5E, the device has a quadrangular frame shape, and the origin G1 is set at an apex of one corner of the device DV positioned on the virtual axis Axis.

Figure 5C:
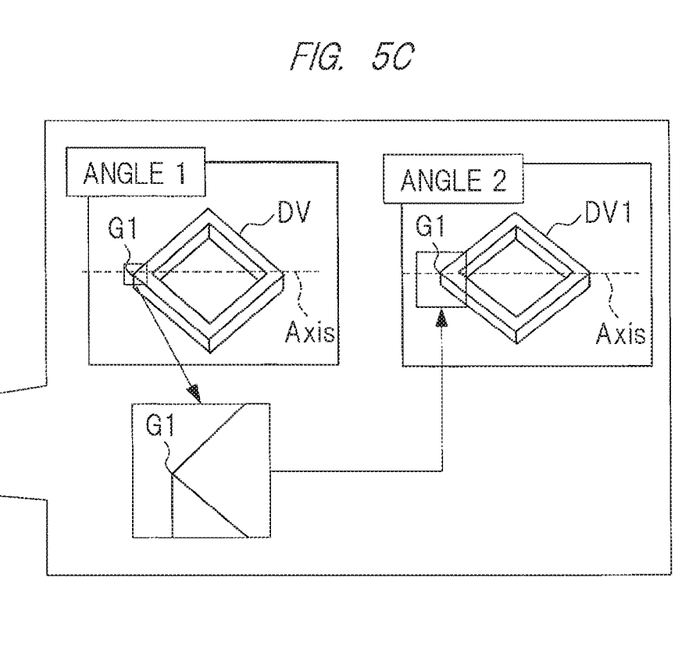
FIG. 5C is an explanatory diagram showing one example of an exact positional alignment process at a process of a step S205 and a process of a step S208 of FIG. 4.

As shown in FIG. 5C, the exact positional alignment process is executed so that the origins G1 of the device DV whose image has been captured at the stage angle 1 and the device DV1 whose image has been captured at the stage angle 2 match each other. That is, the exact positional alignment process is such a positional alignment process as exactly matching points of two images on the virtual axis.

Figure 5D:
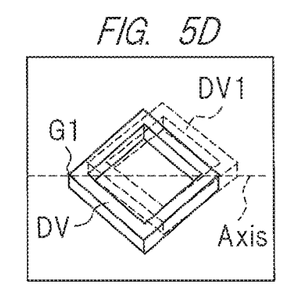
FIG. 5D is an explanatory diagram showing one example of an exact positional alignment process at a process of a step S205 and a process of a step S208 of FIG. 4.

When the stage 16 is tilted by using an eucentric mechanism of the stage 16 included in the SEM apparatus 11, the image of the device DV acquired at the inclination angle of the stage angle 1 shown with a solid line and the image of the device DV1 acquired at the inclination angle of the stage angle 2 shown with a dotted line are different in the position from each other as shown in FIG. 5d.

If the three-dimensional image is created from such two images whose positions are different from each other, there is a risk of creation of a noisy image.

Figure 5E:
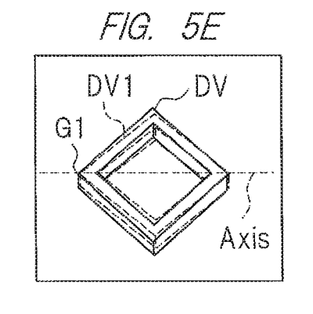
FIG. 5E is an explanatory diagram showing one example of an exact positional alignment process at a process of a step S205 and a process of a step S208 of FIG. 4.

On the other hand, if the exact positional alignment process is performed at the processes of the steps S205 and S208 of FIG. 4, the origin G1 of the device DV acquired at the inclination angle of the stage angle 1 and the origin G1 of the device DV1 acquired at the inclination angle of the stage angle 2 match each other as shown in FIG. 5E, so that the difference in the position between the two images can be reduced.

Therefore, the three-dimensional image is created from the two images whose positions are not different from each other, so that the accurate three-dimensional image having a small amount of noises can be created.

Subsequently, a calculation technique of the stage angle 1 and the stage angle 2 performed by the stage-angle calculation unit 31 will be described.

Figure 6A:
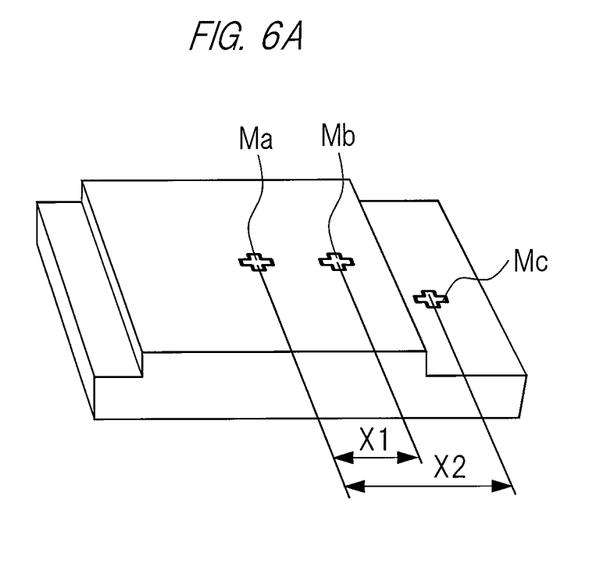
FIG. 6A is an explanatory diagram showing one example of a principle of measurement for inclination angles of a stage angle 1 and a stage angle 2 at a process of a step S212 of FIG. 4.
Figure 6B:
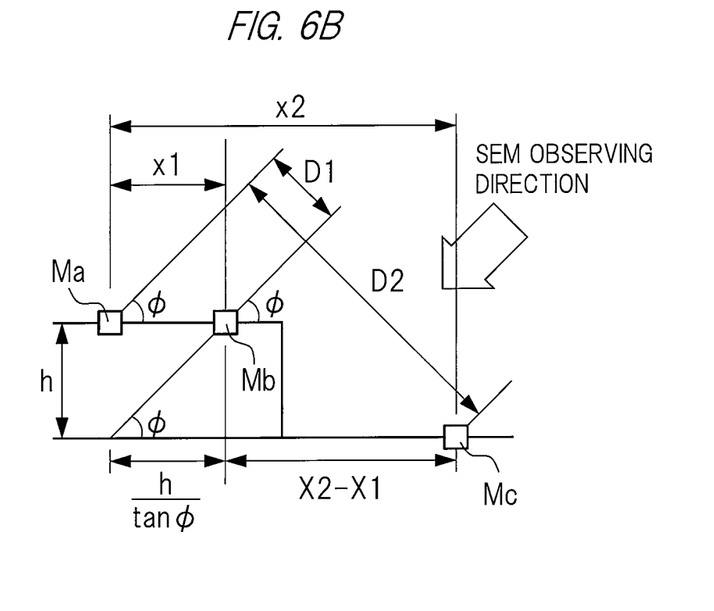
FIG. 6B is an explanatory diagram showing one example of a principle of measurement for inclination angles of a stage angle 1 and a stage angle 2 at a process of a step S212 of FIG. 4.

FIG. 6 is an explanatory diagram showing one example of a principle of measurement for the inclination angles of the stage angle 1 and the stage angle 2 at a process of a step S212 of FIG. 4.

Here, as shown in FIGS. 6A and 6B, it is assumed that each of reference marks Ma, Mb and Mc is formed on the substrate of the MEMS 50. Each relative positional relation between the inclination angles of the stage 16 and the reference marks Ma, Mb and Mc depends on the following equation 1 and equation 2.

By using these equations 1 and 2, the setting angles that are the stage angle 1 and the stage angle 2, heights of the reference marks Ma and Mb, and others can be accurately calculated.

[Expression 1]

$$\phi = \sin^{-1}\left(\frac{D1}{x1}\right) \quad \text{(Equation 1)}$$

$$h = \left(\frac{D2}{D1}x1 - x2\right)\tan\phi \quad \text{(Equation 2)}$$

$\phi$: (unknown) Setting Angle
$h$: (unknown) Height
$D1$: (known) Distance between "ma" and "mb" in SEM image
$D2$: (known) Distance between "ma" and "mc" in SEM image
$x1$: (known) Distance between "ma" and "mb" on Substrate
$x2$: (known) Distance between "ma" and "mc" on Substrate In the above-described manner, the less-error inclination angles of the stage 16 can be used for the creation of the three-dimensional image. As a result, the accurate three-dimensional image having a small amount of noises, that is, having the small shape error, can be created. By using the accurate three-dimensional image having the small shape error, the accurate device property can be calculated.

Further, a result of comparison between the calculated accurate device property and the design data can be quickly fed back to a next manufacturing step. Since the manufacturing step of the next step can be immediately corrected, the development period of the MEMS 50 can be shortened. Also, the manufacturing step of the next step is immediately corrected by using the acquired accurate device property, so that the correction can be reliably fed back to the manufacturing step.

Second Embodiment

<Outline>

The above-described first embodiment has described the technique of creating the three-dimensional image of the device by using the difference between the calculated two stage angles for the correction. The present second embodiment will describe a technique of creating the three-dimensional image of the device by correcting the inclination angles of the stage.

<Correction of Inclination Angle of Stage>

The present second embodiment will describe a technique of correcting the inclination angles of the stage so that the difference between the inclination angles of the stage is within an allowable value range as described above.

Figure 7:
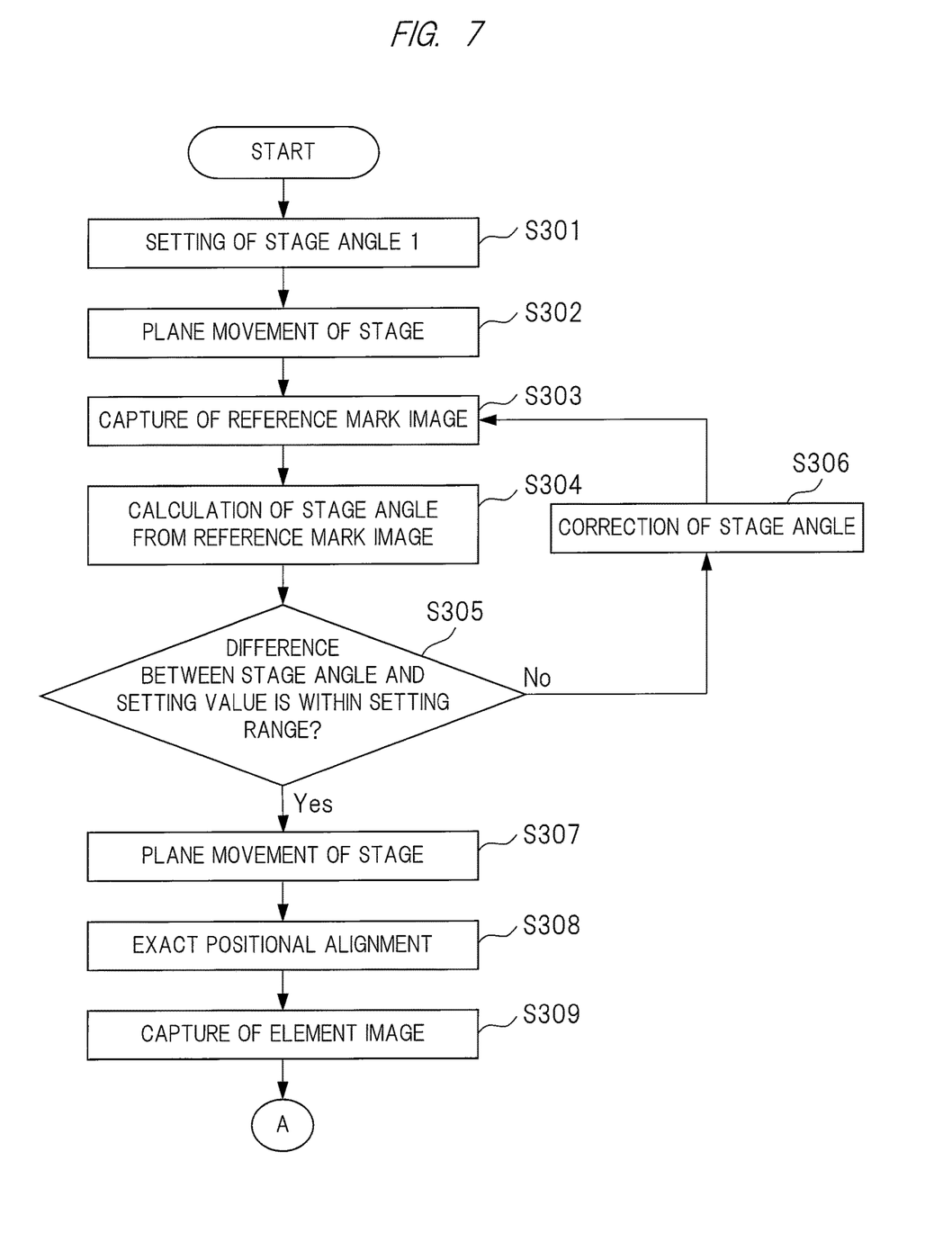
FIG. 7 is a flowchart showing one example of image data acquirement of a device formed on a MEMS according to a second embodiment.
Figure 8:
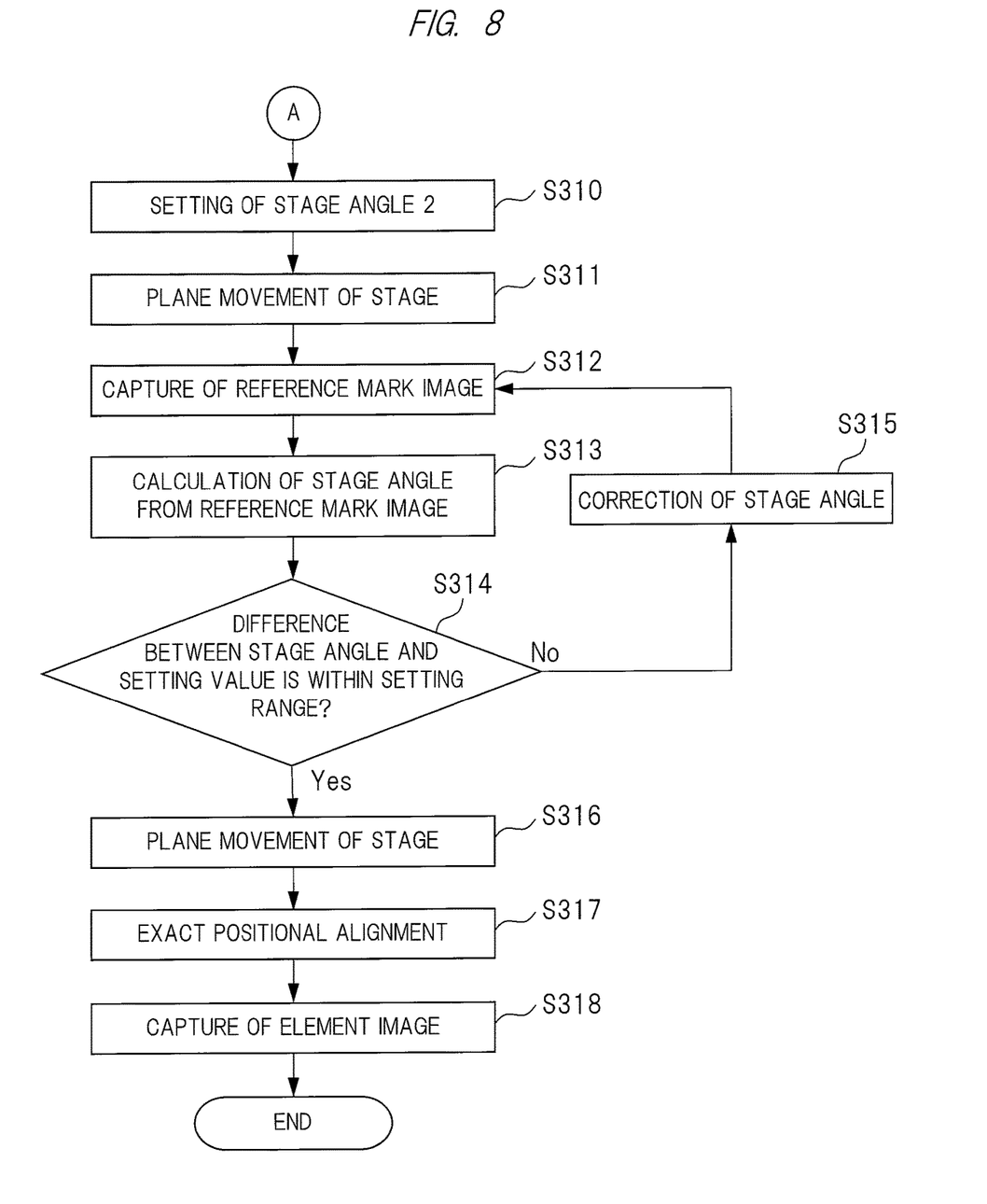
FIG. 8 is a flowchart showing one example of a process continued from FIG. 7.

FIG. 7 is a flowchart showing one example of image data acquirement of the device formed on the MEMS 50 according to the present second embodiment. FIG. 8 a flowchart showing one example of a process continued from FIG. 7.

FIG. 7 shows another process example of the process shown in FIG. 4 according to the above-described first embodiment.

Note that the structure of the MEMS manufacturing system 10 is the same as those in FIGS. 1 and 2 according to the above-described first embodiment, and therefore, the description of the structure is omitted. Also, the entire process in the manufacturing of the MEMS 50 by the MEMS manufacturing system of FIG. 1 is the same as that of FIG. 3 according to the above-described first embodiment, and therefore, the description of the entire process is omitted.

First, in FIG. 7, after the device of the MEMS 50 is fabricated at the process of the step S103 of FIG. 3, the stage control unit 34 of the SEM control unit 21 of FIG. 2 reads the stage angle 1 that is the inclination angle of the stage 16 from the measurement condition data input by the display input apparatus 13, and performs control so that the stage 16 is set at the inclination angle of the read stage angle 1 (step S301).

The stage control unit 34 similarly reads the reference mark data from the memory apparatus 22, and controls the stage 16 based on the read reference mark data so as to move in plane to a position at which the image of the reference mark is intended to be captured (step S302).

After the plane movement of the stage 16 of FIG. 1, the image control unit 35 of FIG. 2 allows the SEM apparatus 11 to capture and acquire the image of the reference mark formed on the MEMS 50 (step S303). These processes of the steps S301 to S303 are the same as the processes of the steps S201 to S203 of FIG. 4.

Subsequently, the stage-angle calculation unit 31 of FIG. 2 calculates the stage angle 1 from the acquired reference mark image, the reference mark data stored in the memory apparatus 22, the measurement condition data, and others (step S304). And, the stage-angle calculation unit 31 stores the calculated stage angle 1 into the memory apparatus 22.

The stage-angle comparison unit 32 of FIG. 2 compares the inclination angle of the stage 16 that is calculated by the stage-angle calculation unit 31 with a setting value that is a previously-set allowable value, and determines whether or not the calculated inclination angle is within a range of the setting value (step S305).

If it is determined at the process of the step S305 that the inclination angle calculated by the stage-angle comparison unit 32 is out of the range of the setting value, the stage control unit 34 adjusts the inclination angle of the stage 16 so that the stage angle 1 is within the range of the setting value (step S306), and then, the process of the step S303 executed again.

If it is determined at the process of the step S305 that the inclination angle calculated by the stage-angle comparison unit 32 is within the range of the setting value, the stage control unit 34 controls the stage 16 to move in plane so that the image of the device that is the image-capturing target for the evaluation is captured (step S307).

Once the plane movement of the stage 16 ends, the stage control unit 34, the image control unit 35, and the image recognition unit 24 execute the exact positional alignment process (step S308).

Once the exact positional alignment process ends, the image control unit 35 allows the SEM apparatus 11 to capture and acquire the image of the device based on the measurement condition data (step S309), and stores the acquired image into the memory apparatus 22.

These processes of the steps S307 to S309 are the same as the processes of the steps S204 to S206 of FIG. 4.

Subsequently, in FIG. 8, the stage control unit 34 acquires the stage angle 2 from the measurement condition data, and sets the stage 16 at the acquired stage angle 2 (step S310).

The stage control unit 34 reads the reference mark data from the memory apparatus 22, and controls the stage 16 based on the read reference mark data so as to move in plane to a position at which the image of the reference mark is intended to be captured (step S311).

After the plane movement of the stage 16, the image control unit 35 allows the SEM apparatus 11 to capture and acquire the image of the reference mark formed on the MEMS 50 (step S312). The process of the step S310 is the same as the process of the step S207 of FIG. 4, and the process of the step S312 is the same as the process of the step S211 of FIG. 4

And, the stage-angle calculation unit 31 calculates the stage angle 2 from the acquired reference mark image, the reference mark data stored in the memory apparatus 22, the measurement condition data, and others (step S313). And, the stage-angle calculation unit 31 stores the calculated stage angle 2 into the memory apparatus 22.

The stage-angle comparison unit 32 compares the inclination angle of the stage 16 that is calculated by the stage-angle calculation unit 31 with a setting value that is a previously-set allowable value, and determines whether or not the calculated inclination angle is within a range of the setting value (step S314).

If it is determined at the process of the step S314 that the inclination angle calculated by the stage-angle comparison unit 32 is out of the range of the setting value, the stage control unit 34 adjusts the angle of the stage 16 again so that the stage angle 2 is within the range of the setting value (step S315), and then, the process of the step S312 is executed again.

If it is determined at the process of the step S314 that the inclination angle calculated by the stage-angle comparison unit 32 is within the range of the setting value, the stage control unit 34 controls the stage 16 to move in plane so that the image of the device that is the image-capturing target for the evaluation is captured (step S316).

Once the plane movement of the stage 16 ends, the stage control unit 34, the image control unit 35, and the image recognition unit 24 execute the exact positional alignment process (step S317). Once the exact positional alignment process ends, the SEM apparatus 11 captures and acquires the image of the target device (step S318).

Then, at the process of the step S105 of FIG. 3, the 3D-data creation unit 25 executes a three-dimensional restructure process that creates a three-dimension image of the target device. At this three-dimensional restructure process, the inclination angle of the stage 16 is used as one parameter for creating the three-dimensional image as described above in the first embodiment.

Here, each of the target device images acquired at the process of the step S318 is acquired when the inclination angle is within the range of the previously-set allowable value. Therefore, the inclination angle of the stage 16 used for creating the three-dimensional image is an angle having a small error, in other words, an angle at which the inclination angle of the stage 16 is within a previously-set error range that is accurately controlled.

By using the inclination angle of the stage 16 that is accurately controlled for the creation of the three-dimensional image as described above, an accurate three-dimensional image having a small amount of noises, that is, having small shape error, can be acquired. By using the accurate three-dimensional image having the small shape error, an accurate device property can be calculated.

Further, a result of comparison between the calculated accurate device property and the design data can be quickly fed back to a next manufacturing step.

The next manufacturing step can be immediately corrected as described above, and therefore, the development period of the MEMS 50 can be shortened. And, the next manufacturing step is immediately corrected by using the acquired accurate device property, so that the feedback to the manufacturing step is reliably achieved.

Note that the present invention is not limited to the foregoing embodiments, and includes various modifications. For example, the above-described embodiments have been explained in detail for easily understanding the present invention, and are not always limited to the ones including all structures explained above.

Also, a part of the structure of one embodiment can be replaced with the structure of another embodiment, and besides, the structure of another embodiment can be added to the structure of one embodiment. Further, another structure can be added to/eliminated from/replaced with a part of the structure of each embodiment.

What claimed is:

1. A MEMS manufacturing system comprising:
an image acquirement unit acquiring image information of a MEMS; and
a manufacturing process unit creating a three-dimensional image of the device formed on the MEMS from the image information acquired by the image acquirement unit, analyzing the created three-dimensional image to estimate a property of the device, and corrects a manufacturing recipe of the MEMS,
wherein the image acquirement unit has a stage on which the MEMS is placed,
the manufacturing process unit has:
a stage control unit;
a stage-angle calculation unit; and
a 3D-data creation unit,
the stage control unit inclining the stage based on a first stage inclination angle to which an inclination angle of the stage on which the MEMS is placed is set and a second stage inclination angle that is a different inclination angle from the first stage inclination angle, the stage-angle calculation unit calculating the stage inclination angles from a first image that is an image for calculating the stage inclination angle acquired by the image acquirement unit when the stage control unit sets the stage to the first stage inclination angle and a second image that is an image for calculating the stage inclination angle acquired by the image acquirement unit when the stage control unit sets the stage to the second stage inclination angle, and the 3D-data creation unit creating three-dimensional data of the device from a third image that is an image of the device acquired when the image acquirement unit sets the stage to the first stage inclination angle and a fourth image that is an image of the device acquired when the image acquirement unit sets the stage to the second stage inclination angle, and
the 3D-data creation unit uses a correction value calculated based on the acquired first image, the acquired second image, the first stage inclination angle set by the stage control unit and the second stage inclination angle set by the stage control unit when the three-dimensional data of the device is created.

2. The MEMS manufacturing system according to claim 1,
wherein the 3D-data creation unit calculates each of a difference between the first stage inclination angle set by the stage control unit and the inclination angle of the stage calculated from the first image by the stage-angle calculation unit and a difference between the second stage inclination angle set by the stage control unit and the inclination angle of the stage calculated from the second image by the stage-angle calculation unit, and uses each of the calculated differences among the inclination angles as a correction value.

3. The MEMS manufacturing system according to claim 2,
wherein the first image and the second image acquired by the image acquirement unit are images of a reference mark indicating a reference point that is previously formed on the MEMS, and
the stage-angle calculation unit calculates the inclination angles of the stage from the reference marks on the first image and the second image, respectively.

4. The MEMS manufacturing system according to claim 2,
wherein the manufacturing process unit has:
a storage unit storing design data of the MEMS and a manufacturing recipe of the MEMS;
a property calculation unit calculating the property of the device from three-dimensional data of the device created by the 3D-data creation unit;
a property comparison unit comparing the property of the device calculated by the property calculation unit with a property of the device contained in the design data stored in the storage unit; and
a manufacturing-recipe correction unit correcting a manufacturing recipe stored in the storage unit based on a result of the comparison made by the property comparison unit so that the property of the device becomes the property of the device contained in the design data.

5. The MEMS manufacturing system according to claim 2 further comprising:
a positional alignment process unit performing a positional alignment process to the third image and the fourth image acquired by the image acquirement unit,
wherein the positional alignment process unit moves the stage so that a position of an origin point set on a virtual axis of the device whose image is captured on the third image when the image acquirement unit acquires the fourth image matches a position of an origin point set on a virtual axis of the device whose image is captured on the fourth image.

6. The MEMS manufacturing system according to claim 1,
wherein the manufacturing process unit has a stage-angle comparison unit determining whether or not each of a difference between the first stage inclination angle set by the stage control unit and the inclination angle of the stage calculated from the first image and a difference between the second stage inclination angle set by the stage control unit and the inclination angle of the stage calculated from the second image is within a range of a previously setting value, the image acquirement unit acquires the third image if the stage-angle comparison unit determines that the difference between the first stage inclination angle set by the stage control unit and the inclination angle of the stage calculated from the first image is within the range of the setting value, and acquires the fourth image if the difference between the second stage inclination angle set by the stage control unit and the inclination angle of the stage calculated from the second image is within the range of the setting value, and the 3D-data creation unit creates three-dimensional data of the device from the third image and the fourth image each of which is acquired by the image acquirement unit.

7. The MEMS manufacturing system according to claim 6, wherein the stage control unit corrects the inclination angle of the stage until each of the differences in the inclination angle of the stage is within the range of the setting value.

8. The MEMS manufacturing system according to claim 6 further comprising:

a positional alignment process unit performing a positional alignment process to the third image and the fourth image acquired by the image acquirement unit, wherein the positional alignment process unit moves the stage so that a position of an origin point set on a virtual axis of the device whose image is captured on the third image when the image acquirement unit acquires the fourth image matches a position of an origin point set on a virtual axis of the device whose image is captured on the fourth image.

9. The MEMS manufacturing system according to claim 6, wherein the manufacturing process unit has:

a storage unit storing design data of the MEMS and a manufacturing recipe of the MEMS;

a property calculation unit calculating the property of the device from three-dimensional data of the device created by the 3D-data creation unit;

a property comparison unit comparing the property of the device calculated by the property calculation unit with a property of the device contained in the design data stored in the storage unit; and a manufacturing-recipe correction unit correcting a manufacturing recipe stored in the storage unit based on a result of the comparison made by the property comparison unit so that the property of the device becomes the property of the device contained in the design data.

10. A method of manufacturing a MEMS performed by a MEMS manufacturing system having an image acquirement unit having a stage on which the MEMS is placed and acquiring image information of the MEMS and a manufacturing process unit creating a three-dimensional image of the device formed on the MEMS from the image information acquired by the image acquirement unit, analyzing the created three-dimensional image to estimate a property of the device, and correcting a manufacturing recipe of the MEMS, the method comprising the steps of:

allowing the manufacturing process unit to set the stage at a first stage inclination angle at which an inclination angle of the stage on which the MEMS is placed is set;

allowing the image acquirement unit to acquire each of a first image that is an image of a reference mark formed on the MEMS placed on the stage set at the first inclination angle and a third image that is an image of the device;

allowing the manufacturing process unit to set the stage at a second stage inclination angle at which an inclination angle of the stage on which the MEMS is placed is set;

allowing the image acquirement unit to acquire each of a second image that is an image of a reference mark formed on the MEMS placed on the stage set at the second inclination angle and a fourth image that is an image of the device; and allowing the manufacturing process unit to create three-dimensional data of the image of the device from the third image and the fourth image, wherein, at the step of creating the three-dimensional data, the inclination angles of the stage are calculated from the reference mark of the acquired first image and the reference mark of the acquired second image, respectively, each of a difference between the first stage inclination angle and the inclination angle of the stage calculated from the first image and a difference between the second stage inclination angle and the inclination angle of the stage calculated from the second image is calculated, and each of the calculated differences among the inclination angles is used as a correction value for creating the three-dimensional data.

11. The method of manufacturing the MEMS according to claim 10 further comprising the steps of:

allowing the manufacturing process unit to calculate the property of the device from created three-dimensional data of the device and compare the calculated property of the device with a property of the device contained in the design data; and allowing the manufacturing process unit to correct a manufacturing recipe based on a result of the comparison at the step of comparing the properties so that the property of the device becomes the property of the device contained in the design data of the MEMS.

12. The method of manufacturing the MEMS according to claim 10 further comprising the step of allowing the manufacturing process unit to move the stage so that a position of an origin point set on a virtual axis of the device on the third image before the fourth image is acquired matches a position of an origin point set on a virtual axis of the device on the fourth image.

13. The method of manufacturing the MEMS according to claim 10 further comprising the steps of allowing the manufacturing process unit to determine whether or not a difference between the set first stage inclination angle and the inclination angle of the stage calculated from the first image is within a range of a previously setting value;

allowing the image acquirement unit to acquire an image of the device as the third image if it is determined that the difference between the set first stage inclination angle and the inclination angle of the stage calculated from the first image is within the range of the setting value;

allowing the manufacturing process unit to determine whether or not a difference between the set second stage inclination angle and the stage inclination angle calculated from the second image is within a range of a previously setting value; and allowing the image acquirement unit to acquire an image of the device as the fourth image if it is determined that the difference between the set second stage inclination angle and the inclination angle of the stage calculated from the second image is within the range of the setting value.

14. The method of manufacturing the MEMS according to claim 13, wherein, at the step of determining whether or not each of the differences is within the range of the setting value, the inclination angles of the stage are corrected until each of the differences among the inclination angles of the stage is within the range of the setting value.

15. The method of manufacturing the MEMS according to claim 13 further comprising the step of allowing the manufacturing process unit to move the stage so that a position of an origin point set on a virtual axis of the device on the third image before the fourth image is acquired matches a position of an origin point set on a virtual axis of the device on the fourth image.

\* \* \* \* \*